(12) United States Patent
Hamster et al.

(10) Patent No.: US 6,775,308 B2
(45) Date of Patent: Aug. 10, 2004

(54) MULTI-WAVELENGTH SEMICONDUCTOR LASER ARRAYS AND APPLICATIONS THEREOF

(75) Inventors: Harald Hamster, Bedford, NH (US); John Trezza, Nashua, NH (US)

(73) Assignee: Xanoptix, Inc., Merrimack, NH (US)

( * ) Notice: Subject to any disclaimer, the term of this patent is extended or adjusted under 35 U.S.C. 154(b) by 0 days.

(21) Appl. No.: 10/180,603

(22) Filed: Jun. 26, 2002

(65) Prior Publication Data

US 2003/0081638 A1 May 1, 2003

Related U.S. Application Data

(63) Continuation-in-part of application No. 09/897,160, filed on Jun. 29, 2001, now Pat. No. 6,724,794, and a continuation-in-part of application No. 09/897,158, filed on Jun. 29, 2001, now Pat. No. 6,753,197, and a continuation-in-part of application No. 09/896,983, filed on Jun. 29, 2001, and a continuation-in-part of application No. 09/896,797, filed on Jun. 29, 2001, and a continuation-in-part of application No. 09/896,189, filed on Jun. 29, 2001, now Pat. No. 6,620,642

(60) Provisional application No. 60/365,996, filed on Mar. 19, 2002, provisional application No. 60/365,489, filed on Mar. 18, 2002, and provisional application No. 60/302,600, filed on Jun. 29, 2001.

(51) Int. Cl.[7] .................................................. H01S 3/10
(52) U.S. Cl. .............................. 372/28; 372/43; 372/44; 372/45; 372/46; 372/47; 372/48; 372/49; 372/50; 372/38
(58) Field of Search ........................... 372/28, 38.1, 38, 372/43–50

(56) References Cited

U.S. PATENT DOCUMENTS

| | | | |
|---|---|---|---|
| 4,481,403 A | * | 11/1984 | Del Monte ................. 219/209 |
| 4,533,833 A | | 8/1985 | Copeland et al. |
| 5,100,480 A | | 3/1992 | Hayafuji |
| 5,266,794 A | | 11/1993 | Olbright et al. |
| 5,269,453 A | | 12/1993 | Melton et al. |
| 5,299,222 A | | 3/1994 | Shannon et al. |
| 5,385,632 A | | 1/1995 | Goossen |
| 5,477,933 A | | 12/1995 | Nguyen |
| 5,485,480 A | | 1/1996 | Kleinerman |
| 5,499,313 A | | 3/1996 | Kleinerman |
| 5,511,085 A | | 4/1996 | Marshall |
| 5,521,734 A | | 5/1996 | Frigo |
| 5,602,863 A | | 2/1997 | Itagaki |
| 5,637,885 A | | 6/1997 | Heinemann et al. |
| 5,715,270 A | | 2/1998 | Zediker et al. |
| 5,729,038 A | | 3/1998 | Young et al. |
| 5,764,392 A | * | 6/1998 | Van As et al. ................. 398/79 |
| 5,793,789 A | | 8/1998 | Ben-Michael et al. |
| 5,814,889 A | | 9/1998 | Gaul |
| 5,861,968 A | | 1/1999 | Kerklaan et al. |
| 5,909,294 A | | 6/1999 | Doerr et al. |
| 5,912,997 A | | 6/1999 | Bischel et al. |
| 5,946,130 A | | 8/1999 | Rice |

(List continued on next page.)

OTHER PUBLICATIONS

Ahadian, J.F., et al., "Practical OEIC's Based on the Monolithic Integration of GaAs–InGap LED's with Commerical GaAs VLSI Electronics", IEEE Journal of Quantum Electronics, vol. 34, No. 7, pp. 1117–1123, Jul. 1998.

(List continued on next page.)

*Primary Examiner*—Don Wong
*Assistant Examiner*—Delma R. Flores-Ruiz
(74) *Attorney, Agent, or Firm*—Morgan & Finnegan, LLP

(57) ABSTRACT

A multi-wavelength laser array has a group of multiple lasers, each of the lasers in the group being constructed to emit at a specified wavelength within a range, the specified wavelength of one laser being different from the specified wavelength of the other lasers in the group. The lasers in the group are individually selectable so that, when emission at a particular wavelength is called for, a laser capable of providing the particular wavelength will be selected.

3 Claims, 5 Drawing Sheets

U.S. PATENT DOCUMENTS

| | | | |
|---|---|---|---|
| 5,962,846 A | 10/1999 | Goossen | |
| 5,991,479 A | 11/1999 | Kleinerman | |
| 6,005,262 A | 12/1999 | Cunningham | |
| 6,023,361 A | 2/2000 | Ford et al. | |
| 6,048,751 A | 4/2000 | D'Asaro et al. | |
| 6,118,908 A | 9/2000 | Bischel et al. | |
| 6,136,623 A | 10/2000 | Hofstetter et al. | |
| 6,172,417 B1 | 1/2001 | Goossen | |
| 6,184,066 B1 | 2/2001 | Chino et al. | |
| 6,215,114 B1 | 4/2001 | Yagi et al. | |
| 6,253,986 B1 | 7/2001 | Brofman | |
| 6,283,359 B1 | 9/2001 | Brofman | |
| 6,317,235 B1 | 11/2001 | Hamilton | |
| 6,340,113 B1 | 1/2002 | Avery et al. | |
| 6,343,171 B1 | 1/2002 | Yoshimura et al. | |
| 6,404,542 B1 | 6/2002 | Ziari et al. | |
| 6,438,150 B1 * | 8/2002 | Yoo | 372/49 |
| 6,532,101 B2 * | 3/2003 | Islam et al. | 359/334 |
| 6,553,044 B1 * | 4/2003 | Eden | 372/38.02 |
| 2001/0020793 A1 | 9/2001 | Honda | |
| 2001/0030782 A1 | 10/2001 | Trezza | |
| 2001/0038103 A1 | 11/2001 | Nitta et al. | |
| 2002/0051268 A1 | 5/2002 | Tonehira et al. | |
| 2001/0081773 | 6/2002 | Inoue et al. | |
| 2002/0154355 A1 | 10/2002 | Payne et al. | |
| 2002/0168139 A1 | 11/2002 | Clarkson et al. | |

OTHER PUBLICATIONS

Aronson, L.B., "Low–Cost Multimode WDM for Local Area Networks Up to 10 Gb/s", *IEEE Photonics Technology Letters*, vol. 10, No. 10, pp. 1489–1491, Oct. 1998.

Alduino, A.C. et al., "Quasi–Planar Monolithic Integration of High–Speed VCSEL and Resonant Enhanced Photodetector Arrays", IEEE Photonics Technology Letters, vol. 11, No. 5, pp. 512–514, May 1999.

Anderson, B., "Rapid Processing And Properties Evaluation Of Flip–Chip Underfills", Dexter Electronic Materials, 9 pages.

Corbett, B. et al., "Resonant Cavity Light Emitting Diode and Detector Using Epitaxial Liftoff", IEEE vol. 5, No. 9, pp. 1041–1043, Sep. 1993.

Fiore, A. et al., "Postgrowth Tuning of Semiconductor Vertical Cavities for Multiple–Wavelength Laser Arrays", *IEEE Journal of Quantum Electronics*, vol. 35, No. 4, pp. 616–623, Apr. 1999.

Leib, K.M. et al., "Monolithically Integrated VCELs and Photodetectors for Microsystem Applications", IEEE, pp. 27–28, 1998.

Goodman, J. et al., "Optical Interconnections for VLSI Systems", Proceedings of the IEEE, vol. 72, No. 7, pp. 850–865, Jul. 1984.

Goosen, K. W. et al., "GaAs 850 nm Modulators Solder–Bonded to Silicon", IEEE Photonics Technology Letters, vol. 5, No. 7, Jul. 1993.

Goosen, K.W. et al., "GaAs MQW Modulators Integrated with Silicon CMOS", IEEE Photonics Technology Letters, vol. 7, No. 4, pp. 360–362, Apr. 1995.

Hibbs–Brenner, M.K., et al., "VCSEL/MSM Detector Smart Pixel Arrays", IEEE, pp. 3 and 4, 1998.

Lesser, M.P. et al., "Bump Bonded Back Illuminated CCDs", SPIE, vol. 1656, pp. 508–516, 1992.

MacDougal H. and Dapkus, P. "Wavelength Shift of Selectively Oxidized $Al_xO_y$—AlGaAs–GaAs Distributed Bragg Reflectors", *IEEE* pp. 884–886, 1997.

McLaren T. et al., "Assembly of VCSEL Based Smart Pixel Arrays", IEEE/LEOS Summer Topical Meeting: Smart Pixels, pp. 49 and 50, Aug. 1996.

Nakahara, T., et al., "Hybrid Integration of Smart Pixels by Using Polyimide Bonding: Demonstration of a GaAs p–i–n Photodiode/CMOS Receiver", IEEE Journal Of Selected Topics In Quantum Electronics, pp. 209–216, 1999.

Ohsaki, T., "Electronic Packaging in the 1990's–A Perspective From Asia", IEEE Transactions On Components, Hybrids, And Manufacturing Technology, vol. 14, No. 2, pp. 254–261, Jun. 1991.

Pommerrenig, D.H. et al., "Hybrid silicon focal plane development: an update", SPIE, vol. 267, pp. 23–30, 1981.

Pu, R. et al., "Comparison of Techniques for Bonding VCSELs Directly to ICs", SPIE vol. 3490, pp. 498–501, Jun. 2005.

Pu, R. et al., "Hybrid Integration of VCSELs to Foundry Fabricated Smart Pixels", IEEE/LEOS Spring Meetings, pp. 25 and 26, 1997.

Sasaki, J. et al., "Self–aligned Assembly Technology for Optical Devices Using AuSn Solder Bumps Flip–Chip Bonding", pp. 260–261.

* cited by examiner

Time = $t_1$

Time = $t_n$

FIG. 6

MULTI-WAVELENGTH SEMICONDUCTOR LASER ARRAYS AND APPLICATIONS THEREOF

CROSS REFERENCE TO RELATED APPLICATIONS

This application claims priority under 35 USC 119(e)(1) of U.S. Provisional Patent Application Serial No.60/365,996, filed Mar. 19, 2002, U.S. Provisional Patent Application Serial No.60/302,600, filed Jun. 29, 2001, and U.S. Provisional Patent Application Serial No.60/365,489, filed Mar. 18, 2002.

This application is also a continuation in part of commonly assigned U.S. patent application Ser. No. 09/896,189, now U.S. Pat. No. 6,620,642 application Ser. No. 09/897,160, now U.S. Pat. No. 6,724,794 application Ser. No. 09/896,983, application Ser. No. 09/897,158 now U.S. Pat. No. 6,753,197 and U.S. patent application Ser. No. 09/896,797, all filed Jun. 29, 2001.

FIELD OF THE INVENTION

This invention relates to lasers and, more particularly, to arrays of lasers.

BACKGROUND

Single element tunable lasers have been created using micromachined devices, temperature change or electron injection tuning. However, all such wavelength tuning techniques are "analog" tuning techniques. All of the methods change the optical length of the laser cavity, which affects the resonant wavelength in the laser. This change in laser cavity length is typically achieved in one of two ways.

One way the physical length of the cavity can be changed is shown in FIG. 1. FIG. 1 is an example of a mechanically tunable vertical cavity surface emitting laser 100 (VCSEL) of the prior art. With a VCSEL 100 of FIG. 1, tuning is performed by either using a micromachined mirror 102 fixed on the laser substrate, which can be moved up and down (i.e. closer or farther relative to the cavity), or by using an external mirror separate from the laser that can be physically moved, so the cavity length can be physically changed. To tune a laser with a micromachine however, such as shown in FIG. 1, requires up to 100 Volts to move the mirror. For an externally tuned laser, a separate mechanical or piezoelectric motor must be used, thereby requiring large voltages as well.

The other way to change the cavity length is to change the perceived length of the device, for example, by changing the refractive index of the material, which affects the speed of light in the material and hence its wavelength.

FIG. 2 is an example of a temperature tunable distributed feedback (DFB) 200 laser of the prior art. Temperature tuning is done by adding additional contacts onto the laser and heating the laser material 202, such as shown in FIG. 2, which changes its wavelength. Another way to change the refractive index is by injecting extra electrons into the structure, which creates a carrier induced index change. Thermal or injection tuning, however, requires large currents (that are not used for lasing) to be put into the device structure which significantly impacts power usage.

While changing the wavelength of a laser can be intentionally accomplished, because changing the temperature changes the wavelength, such temperature based wavelength changes, when unintentional, can be detrimental. Thus, in cases where a very accurate wavelength is required from a fixed wavelength laser, the laser must have some form of active temperature compensation (for example by using a thermoelectric cooler) to adjust for wavelength drift caused by the temperature change.

In other tunable lasers, cavity length (actual or perceived) tuning can be used to compensate for temperature drift, but the tuning mechanism takes significant power.

Moreover, the equipment required to compensate for temperature drift is large, bulky and expensive, in both material cost and power usage.

Thus, all of these analog tuning methods lack precision and controllability and/or require high power. Moreover, lasers of the prior art can not easily switch between variable wavelength applications and rigorously fixed wavelength ones.

SUMMARY OF THE INVENTION

We have devised a way to create multi-wavelength lasers that are more precise than the multi-wavelength lasers available in the prior art.

We have also devised a way to create multi-wavelength lasers that are more controllable than the multi-wavelength lasers available in the prior art.

We have further devised a way to create multi-wavelength lasers that require less power than the multi-wavelength lasers in the prior art.

We have also devised a way to create multi-wavelength lasers that are "digitally" tuned as opposed to the analog tuning used with multi-wavelength lasers in the prior art.

We have further devised a way to use a single semiconductor laser array for both variable and precision fixed wavelength applications.

By applying the teachings of the invention, multi-wavelength laser arrays can be created that are useable as wavelength routers, as switches, as "digitally" tunable sources, or as a digitally controllable stable wavelength source.

Moreover, by applying the teachings of the invention, no additional power is needed for tuning, so power (and applied current) can be used for sending data to the laser. The power requirements do not change based upon of which laser (and thus which wavelength) is selected or because of temperature induced wavelength drift.

The advantages and features described herein are a few of the many advantages and features available from representative embodiments and are presented only to assist in understanding the invention. It should be understood that they are not to be considered limitations on the invention as defined by the claims, or limitations on equivalents to the claims. For instance, some of these advantages are mutually contradictory, in that they cannot be simultaneously present in a single embodiment. Similarly, some advantages are applicable to one aspect of the invention, and inapplicable to others. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

FIG. 6 is an example implementation of the invention employing redundancy; and

DETAILED DESCRIPTION

U.S. Provisional Patent Application Serial No.60/365,996, filed Mar. 19, 2002, U.S. Provisional Patent Application Serial No.60/302,600, filed Jun. 29, 2001, U.S. Provisional Patent Application Serial No.60/365,489, filed Mar. 18, 2002, U.S. patent application Ser. No. 09/896,189, filed Jun. 29, 2002, and U.S. patent application Ser. No. 09/896,797, filed Jun. 29, 2002, are all incorporated herein by reference in their entirety.

By integrating a large number of distinct wavelengths on an electronic chip, digital data applied to the chip can select the particular laser on which to send data. In this way, the wavelength of the outgoing beam can be digitally "tuned" and data sent out on a pre-selected output.

In an alternative variant of a system constructed according to the teachings of the invention, a temperature sensor exists on, or is closely associated with, the chip. Depending upon the temperature, data is sent to an appropriate laser to ensure the data is sent on an accurate wavelength. Advantageously, in accordance with the invention, this can now be done without the need to have large, power-hungry active cooling elements inside the module.

Figure 1:
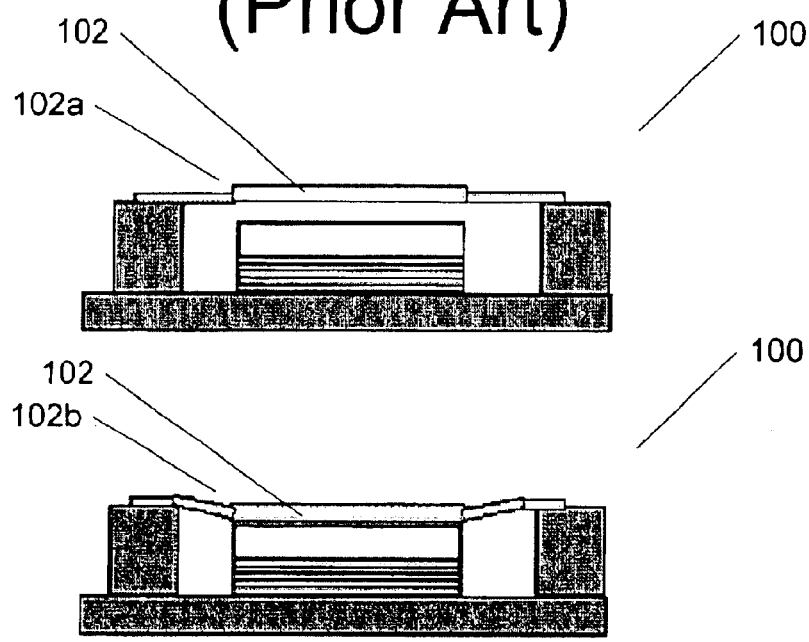
FIG. 1 is an example of a mechanically tunable vertical cavity surface emitting laser (VCSEL) of the prior art.
Figure 2:
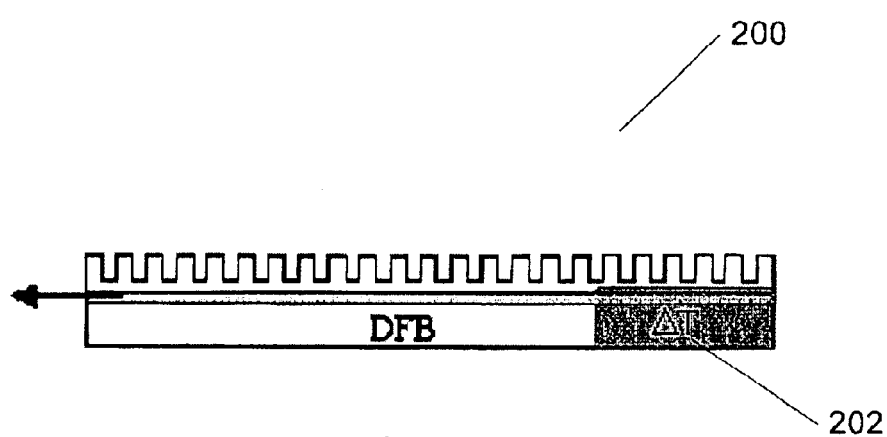
FIG. 2 is an example of a temperature tunable distributed feedback (DFB) laser of the prior art.
Figure 3:
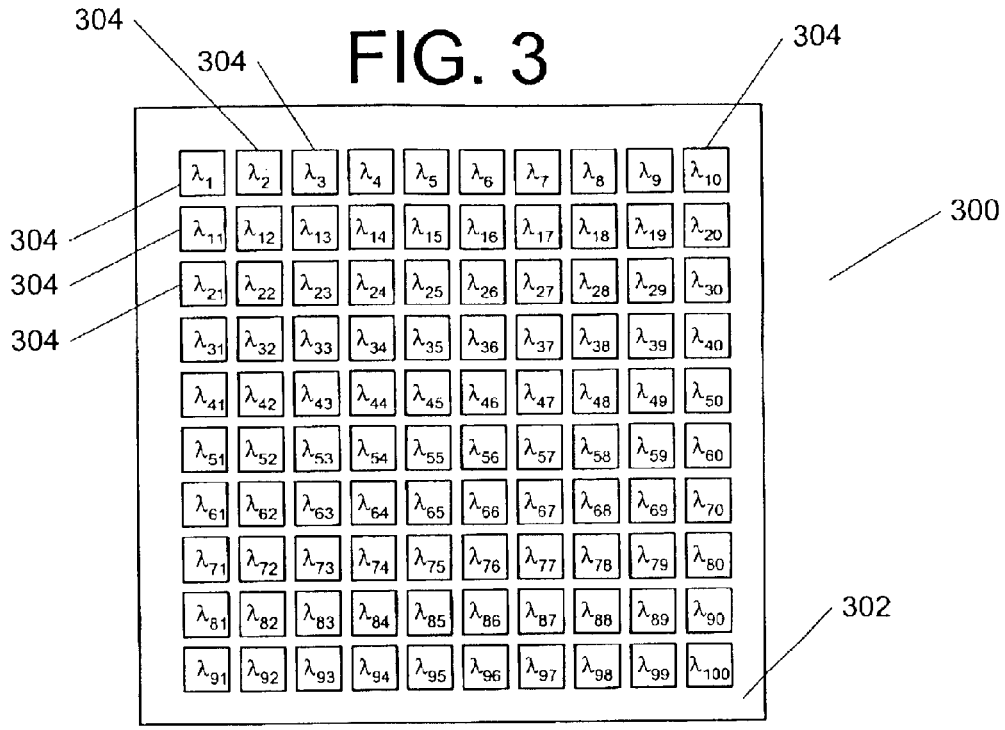
FIG. 3 is an example of a multi-frequency semiconductor laser array in accordance with the present invention.

In overview, we integrate a number of lasers integrated onto an integrated circuit chip such as shown in FIG. 3 is an example implementation of an array 300 according to the invention where 100 different wavelength lasers are integrated onto a common electronic chip 302. This is done, for example, as described in commonly assigned U.S. patent application Ser. No. 09/896,189, the entirety of which is incorporated herein by reference. The lasers are grouped and individually controlled or controlled, as if they were redundant lasers, for example, as shown and described in commonly assigned U.S. patent application Ser. No. 09/896,797, the entirety of which is incorporated herein by reference.

Each of the lasers is either pre-made to operate at a different wavelength or the lasers are post-processed or tuned, after integration with an integrated circuit, to create a chip in which each laser has individual wavelengths.

Figure 4A:
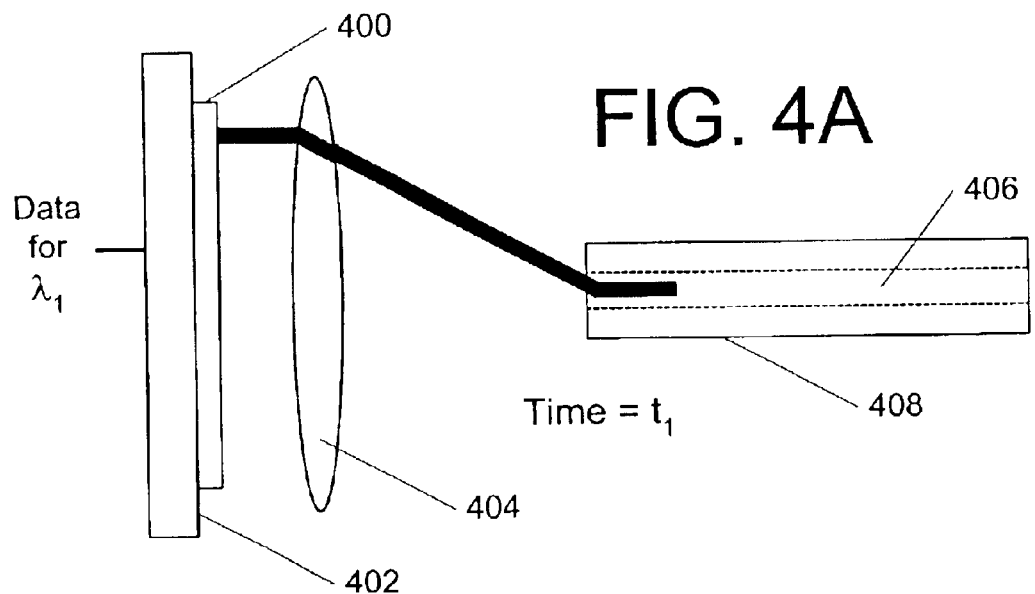
FIGS. 4A and 4B are examples of a multi-frequency semiconductor laser array in accordance with the present invention.
Figure 4B:
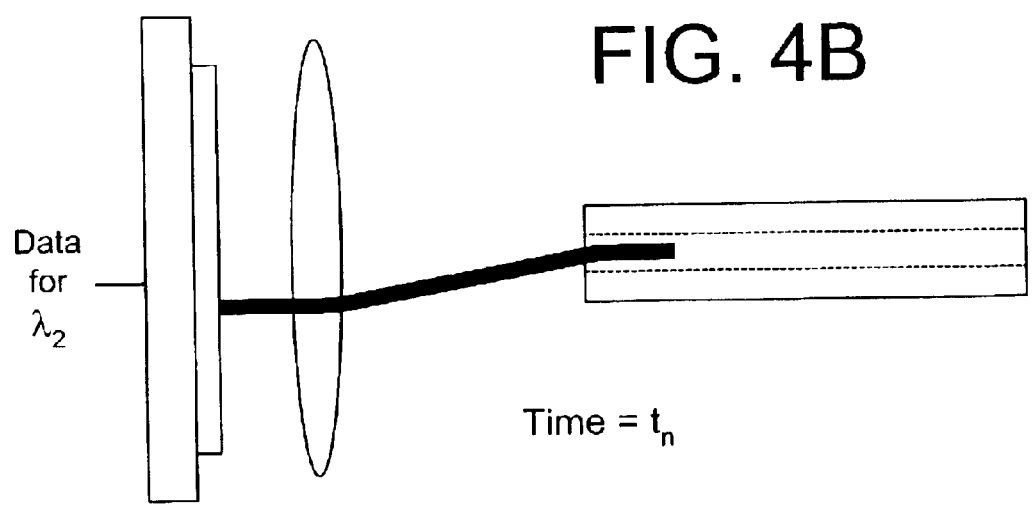

The lasers are individually selectable and controlled, for example, by associating each laser with a particular data address or by having a data array where the state of a bit indicates whether that laser is on or off. FIGS. 4A and 4B are examples of a semiconductor laser array according to the invention. An array of lasers 400 are integrated with an electronic chip 402 that provides the appropriate circuitry for selecting and driving the laser. The individual lasers in the array emit at different wavelengths so that when, at some point in time, one wavelength (λ) is called for by particular data the appropriate laser to provide a signal at that wavelength (FIG. 4A). At some later point in time, when the data indicates a different wavelength is required, a different laser having the appropriate wavelength is switched in (FIG. 4B). Since individual lasers are used, the operation of each can be extremely well known. As a result, very accurate wavelength control becomes possible. Thus, whereas in the prior art, precise voltages or currents need to be controlled to get a specific wavelength. In accordance with the invention, the use of individual lasers and digital selection allows simply picking a particular wavelength, identifying the proper laser and turning it on. The approach does not need to maintain or adjust any specific value of voltage or current to keep the device active.

Figure 5:
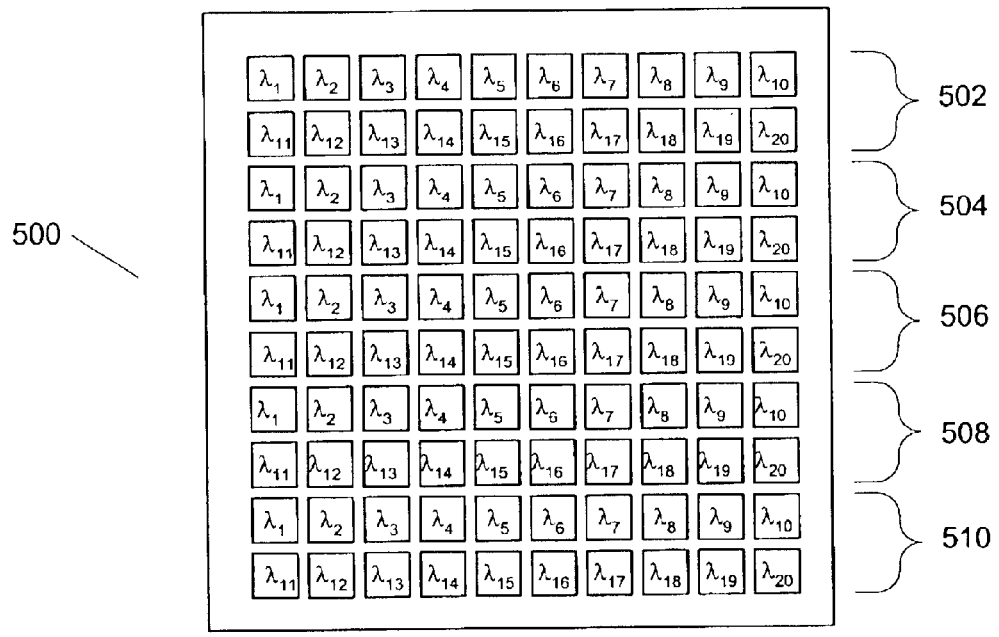
FIG. 5 is an example implementation of the invention having 5 channels capable of sending in parallel.

In alternative variants, the number of wavelengths can be less than the number of lasers where multiple, parallel data channels can be simultaneously used. This is shown in FIG. 5 where there are 5 parallel channels of 20 different wavelength lasers. In parallel data channel variants, the chip is partitioned into sections 502, 504, 506, 508, 510 so that the lasers within each section have different wavelengths from each other but the sections are duplicates of each other, and each section is associated with at least one fiber.

Figure 6:
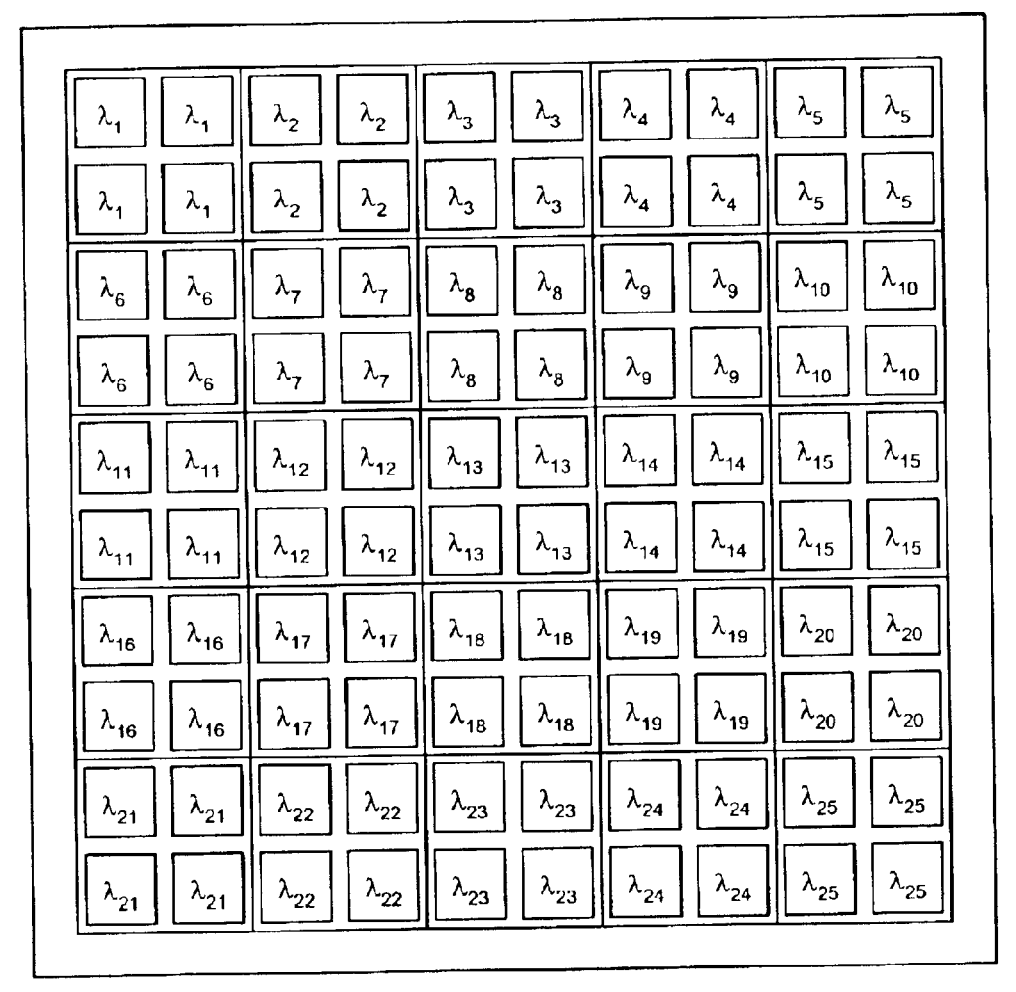

In yet other variants, redundancy can be added on a macro-level by creating two or more identical sections as described above or groups of identical wavelength lasers, such as shown in FIG. 6 and coupling them to a common fiber. This can be done, for example, using a technique described in commonly assigned U.S. Provisional Application Serial No. 60/365,489, filed Mar. 18, 2001, entitled "Long-Throw, Tight Focusing Optical Coupler", the entire disclosure of which is incorporated herein by reference.

Depending upon the particular implementation, a system implementing the present invention will be configured to correlate a desired wavelength with a particular laser, so that for example, a user can select the wavelength of the signal and the particular laser will be automatically selected via the integrated circuit. Alternatively, the integrated circuit can be set up so that, as parameters such as changes in temperature or changes in laser wavelength due to aging, for example, are automatically compensated for by selecting different lasers over time, as appropriate, for the same wavelength.

In operation, assuming an array such as shown in FIG. 3, where each laser has a unique wavelength, when data is to be sent via the lasers the "user" (which could be a person or some device) selects the wavelength that data is to be sent on. The system applies data to the chip to select the particular laser for that wavelength. This is accomplished, in some variants, by directly addressing the particular laser by providing a laser address or, in other variants, by applying data indicating the desired wavelength and having the chip select the particular laser.

By using digital selection and/or addressing techniques switching among lasers is accomplished on a bit-by-bit basis. This provides a speed advantage for some implementations over the prior art because wavelength switching can be accomplished in about 100 picoseconds versus using the prior art micromachines or temperature/injection tuning which takes about a fraction of a millisecond or more. Thus, by applying the teachings of the invention, wavelength tuning times can be about one million times faster than available in the prior art.

Advantageously, in some variants where the laser address is provided, the chip can perform a "transformation" whereby, even though it receives an address indicating a specific laser, it turns on a different laser so as to provide the wavelength indicated by the address, rather than turning on the laser indicated by the address, for example based upon other available information such as from a temperature sensor or feedback from a device measuring output wavelengths.

In some variants, the integrated circuit chip either has built-in temperature sensors throughout the chip that periodically or continuously monitor temperature throughout the chip, or one or more closely associated temperature sensors (i.e. on, and/or adjacent to, the chip) that periodically or continuously monitor temperature. The chip (or an associated control processor that provides control for the chip) adjusts for the sensed temperature and, based upon a conversion, determines which laser should be operated at a given point in time to ensure the proper wavelength for the data is used. Depending upon the particular implementation, this conversion can be formula, data table (for example, look-up or hash table), or other logic based arrangement. Advantageously, because it takes no more power to send data on one laser in the array versus any other laser in the array, unlike the prior art, there is no power impact associated with keeping accurate wavelength control.

Having described the basic principles underlying a multi-wavelength laser array of the present invention, a number of different applications in which the invention can advantageously be used will now be presented.

One application where the teachings of the invention can be used, is where a very stable wavelength is required for output of data, but active temperature control of a module is not desired, and low power operation of the lasers is.

Another application where the teachings of the invention can be used is to provide a digitally selectable, analog tunable laser array. Such an arrangement is useful in situations where you want to have both a broad tuning range and a fine tuning capability at once. This is accomplished by integrating a large number of the analog tunable lasers onto an integrated circuit chip using the teachings described herein in conjunction with those of the incorporated by reference appplications. In such an implementation, it becomes possible to digitally select which laser to operate, for example where some are in the visible range and others are in the infra red range and then analog tuning of each laser is performed within the range.

Other variants accomplish the same effect using only digital tuning. For example, by increasing the number of lasers on the chip and grouping several lasers in one wavelength range, grouping several more lasers in a different range, etc. The lasers within each group have wavelengths that vary slightly from each other in wavelength and from a base wavelength to form a range (i.e. wavelengths of the lasers in the group are different from each other but all fairly close in wavelength to the base wavelength laser). The purpose is to span some portion of, or slightly more than, the range of likely wavelength drift from the base wavelength. From group to group however, the wavelength difference may be much larger. For example, in one variant having multiple groups of lasers, one group can provide wavelengths of 400 nm to 600 nm, another from 900 nm to 1000 nm, yet another from 1260 nm to 1360 nm, still another from 1470 nm to 1520 nm, and another from 1800 nm to 2000 nm. Advantageously, in the prior art, having even a few tunable lasers meant having one or more racks of equipment, whereas in accordance with the teachings of the invention, the same capability can be provided by a single chip.

In still other variants, lasers of common wavelengths in each group are configured so that one or more can be simultaneously active and be coupled to a single fiber. Such a configuration is illustratively shown in FIG. 6. In this manner, a common data stream is sent to all the active lasers of that wavelength, thereby allowing the output power of the data signal to be varied.

Figure 7:
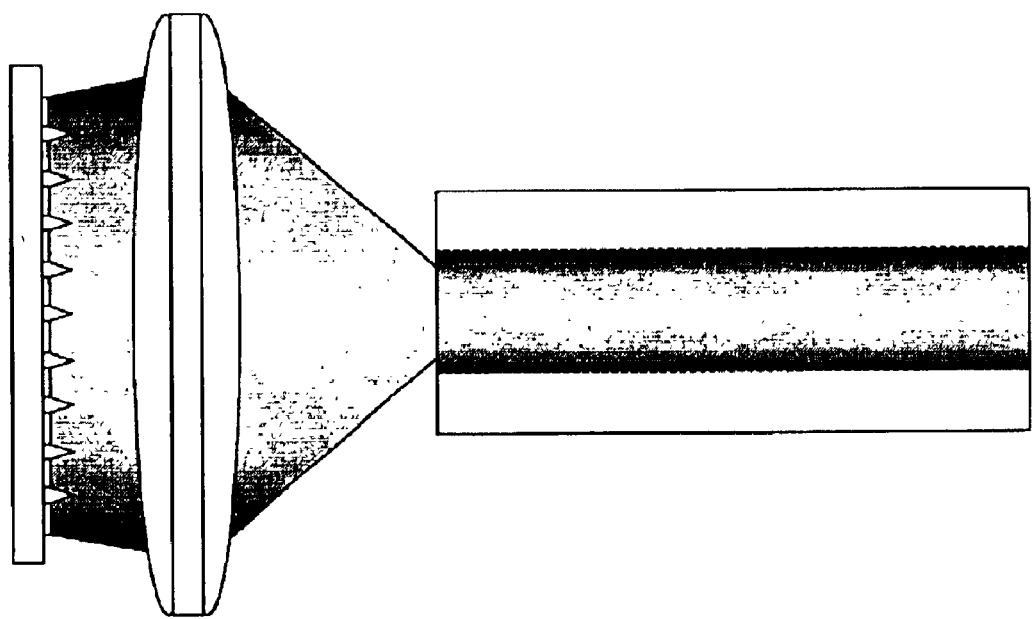
FIG. 7 is an example of a laser according to the present invention employed as a pumping laser.

Alternatively, a similar configuration such as in FIG. 6 also, or alternatively, can be used to provide backups for each wavelength by using multiple lasers of the same wavelength or a single wavelength having redundant individual active regions. In other similar variants that are configured as in FIG. 6, specific lasers of common wavelengths in each group are configured so that all or a sufficient number can be simultaneously active and coupled to a single fiber. In this manner, the chip can also, or alternatively be used as a pumping laser, such as shown in FIG. 7 and described in commonly assigned U.S. Provisional Patent Application Serial No. 60/302,600, filed Jun. 29, 2001, the entirety of which is incorporated by reference.

In still further variants, large numbers of lasers are integrated, based upon different materials from different laser wafers, onto a common electronic chip. As a result, a single chip which has a large wavelength tuning range is created. Thus, while a single analog tunable laser might be able to tune, for example, from 1260 nm to 1360 nm, a single chip in accordance with the invention can be made to be tunable from, for example, about 400 nm to about 2000 nm.

There may, however, be situations where the number of required lasers in a "digital only" scheme becomes so large that the increase in cost becomes a factor. Advantageously, the teachings of the invention can still be used through a combination (analog and digital) approach since it can be more cost effective in some implementations.

While the invention has been described in connection with multiple lasers connected to a common electronic chip, it should be understood that it is consistent with the invention in some variants to have two or more different groups of lasers for a unit each be on their own chip, or some of the lasers in a group on one chip while other lasers in the group are on a different chip.

It should therefore be understood that the above description is only representative of illustrative embodiments. For the convenience of the reader, the above description has focused on a representative sample of all possible embodiments, a sample that teaches the principles of the invention. The description has not attempted to exhaustively enumerate all possible variations. That alternate embodiments may not have been presented for a specific portion of the invention, or that further undescribed alternate embodiments may be available for a portion, is not to be considered a disclaimer of those alternate embodiments. One of ordinary skill will appreciate that many of those undescribed embodiments incorporate the same principles of the invention and others are equivalent.

What is claimed is:

1. A multi-wavelength laser array comprising:
    a group of multiple lasers,
        each of the lasers in the group being constructed to emit at a specified wavelength within a range and receive data for transmission, the data being common to each of the lasers in the group,
        the specified wavelength of one laser being different from the specified wavelength of the other lasers in the group,
        the lasers in the group being individually selectable so that, when emission at a particular wavelength is called for, a laser capable of providing the particular wavelength will be selected to transmit the data.

2. A device comprising:
    multiple semiconductor lasers sharing a common electronic chip, each having an emission wavelength, the emission wavelength of any one of the multiple lasers being different from the others of the multiple lasers,
    the multiple lasers each sharing a common source of data to be output and being individually selectable so that when the data is to be output using a particular specified wavelength by transmission from a laser in the device, a semiconductor laser from among the multiple semiconductor lasers capable of accurately emitting at the particular specified wavelength will be selected to transmit the data.

3. A digitally tunable laser device comprising:

a set of lasers integrated with an electronic chip containing drive and control circuitry for the lasers in the set, the lasers in the set being individually selectable based upon predetermined data, the lasers in the set being constructed to be able to receive transmission data in common and to emit at different wavelengths, and a correlation between the predetermined data and the different wavelengths so that, when a desired emission wavelength for the transmission data is specified by a data signal, the correlation will identify a specific individual laser that will accurately emit the transmission data at the desired emission wavelength.

* * * * *